(12) United States Patent
Morimoto (10) Patent No.: US 7,626,683 B2
(45) Date of Patent: Dec. 1, 2009

(54) EXPOSURE APPARATUS AND DEVICE MANUFACTURING METHOD

(75) Inventor: Yoshihiro Morimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/170,380

(22) Filed: Jul. 9, 2008

(65) Prior Publication Data

US 2009/0015817 A1 Jan. 15, 2009

(30) Foreign Application Priority Data

Jul. 11, 2007 (JP) .............................. 2007-182153

(51) Int. Cl.
  *G03B 27/62* (2006.01)
  *G03B 27/58* (2006.01)
(52) U.S. Cl. .......................................... 355/75; 355/72
(58) Field of Classification Search ................... 355/53, 355/72–76; 378/34, 35; 310/10, 12
  See application file for complete search history.

(56) References Cited

U.S. PATENT DOCUMENTS 5,579,084 A * 11/1996 Takahashi et al. ............. 355/53
5,986,743 A * 11/1999 Hanzawa ...................... 355/53
6,327,026 B1 * 12/2001 Wakui ........................... 355/72
6,956,222 B2 * 10/2005 Gilissen et al. ............ 250/492.2

FOREIGN PATENT DOCUMENTS

| JP | 08-114250 A | 5/1996 |
| JP | 11-153855 A | 6/1999 |
| JP | 2001-044264 A | 2/2001 |
| JP | 2004-078209 A | 3/2004 |
| JP | 2004-158609 A | 3/2004 |

* cited by examiner

*Primary Examiner*—Hung Henry Nguyen
(74) *Attorney, Agent, or Firm*—Canon U.S.A., Inc. I.P. Division (57) ABSTRACT

An exposure apparatus configured to expose a substrate to light to transfer a pattern of a reticle onto the substrate includes a reticle stage configured to mount the reticle, a structure configured to support the reticle stage, a plurality of first supporting members configured to support the structure; and a second supporting member configured to support the structure outside an area formed by connecting the three first supporting members. The second supporting member includes a unit configured to dampen vibration of the structure.

5 Claims, 10 Drawing Sheets

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

Figure 9:
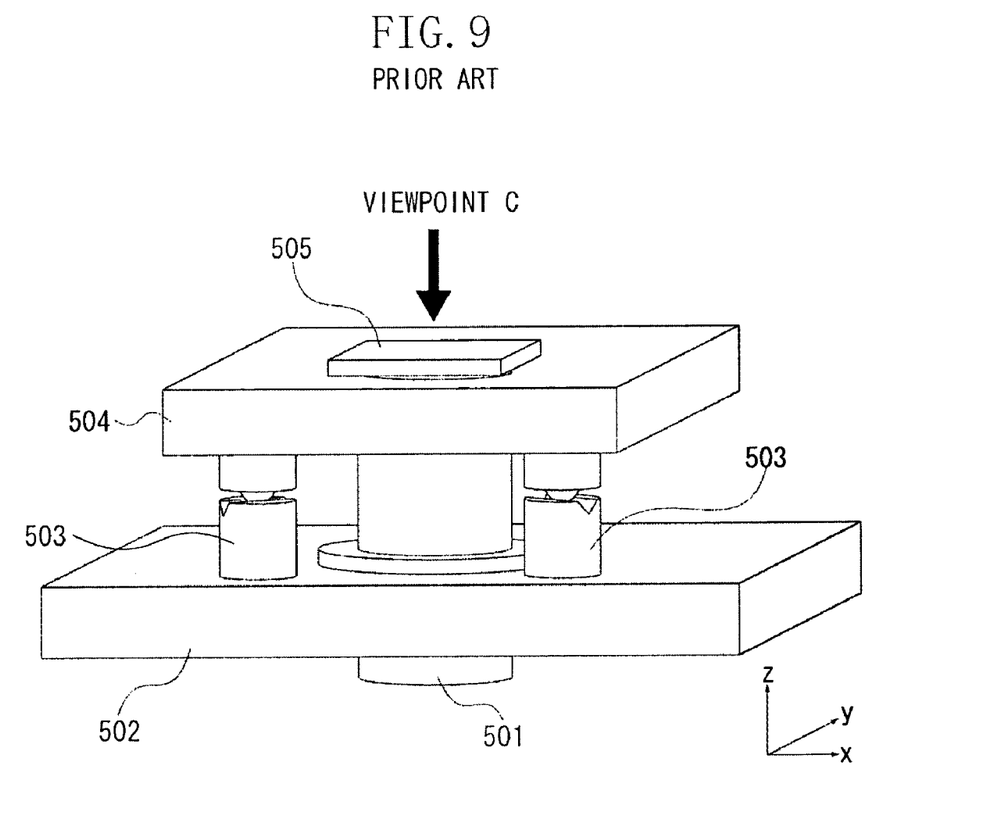
FIG. 9 illustrates a conventional configuration of a structure for supporting a projection optical system, a structure for supporting a reticle stage, and a supporting member configured to connect the structures.
Figure 10:
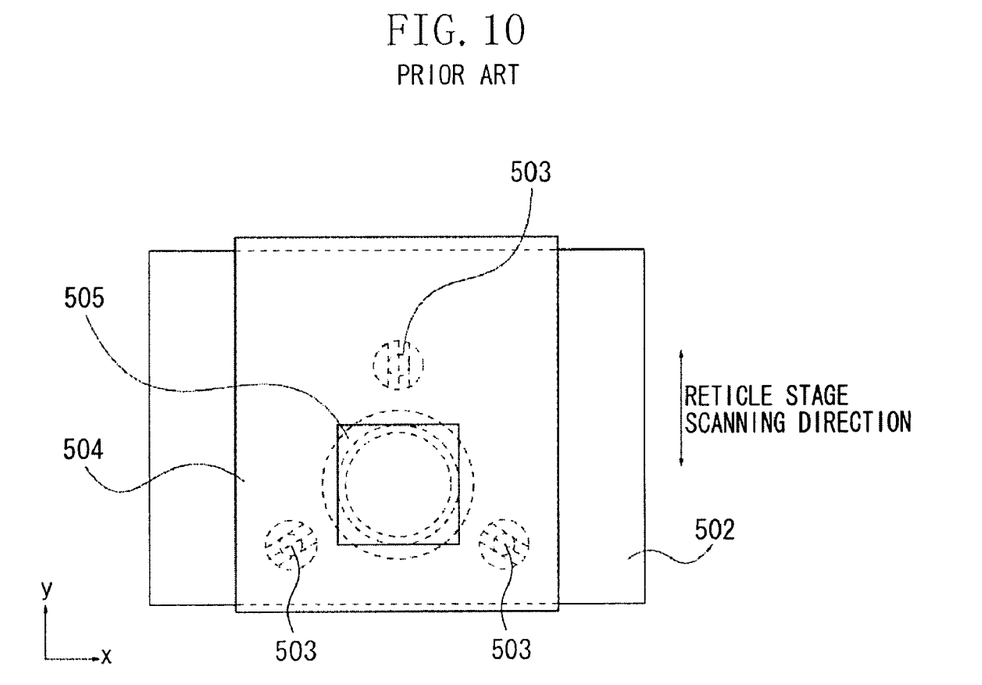
FIG. 10 illustrates the configuration in FIG. 9 when viewed from a viewpoint "C".

A technique used for securing a plane to another plane by fixing three places is discussed in Japanese Patent Application Laid-Open No. 08-114250. Three places are fixed in securing a plane since fixing four or more places will cause excessive constraint which leads to a bending stress in the plane. Japanese Patent Application Laid-Open No. 2001-44264 discusses an exposure apparatus including a structure for supporting a reticle stage which is supported at three places on a mount. Further, as illustrated in FIGS. 9 and 10, an exposure apparatus is known which includes a structure 504 supported at three places on a structure 502. The support is provided by three supporting members 503, two of which are visible in FIG. 9. The structure 504 is configured to support a reticle stage 505 and the structure 502 is configured to support a projection optical system 501.

As illustrated in FIG. 10, a shape of the structure 504 for supporting the reticle stage 505 is generally rectangular. Thus, according to the exposure apparatus in which three supporting members 503 are arranged as illustrated in FIGS. 9 and 10, two of the four corner portions of the structure 504 for supporting the reticle stage 505 will be distant from the supporting members 503. Amplitude of vibration at the corner portions which are not supported by the supporting members 503 increases compared to the corner portions which are supported by the supporting members 503 because the unsupported portions are arranged in a cantilever fashion. Vibration at the corner portions which are not supported is caused by a movement of the reticle stage 505 as well as vibration transmitted from the floor or a wafer stage. Vibration of a mirror or a measurement reference device (not shown) such as an interferometer which is set on the structure 502 for supporting the projection optical system 501 causes an error in a position measurement of the stage. This results in poor alignment at the time of exposure.

Such vibration is more significant when the apparatus is heavier. Thus, the effect of the vibration is more significant as for a heavier reticle stage or a heavier structure which supports the reticle stage than for lighter ones.

SUMMARY OF THE INVENTION

The present invention is directed to reducing vibration which is generated when a corner portion of a structure configured to support a reticle stage is cantilevered.

According to an aspect of the present invention, an exposure apparatus includes a reticle stage, a structure configured to support the reticle stage, and a first supporting member and a second supporting member configured to support the structure. The second supporting member includes a unit configured to dampen vibration of the structure.

According to another aspect of the present invention, a device manufacturing method includes exposing a substrate to light using the above-described exposure apparatus and developing the exposed substrate.

According to exemplary embodiments of the present invention, an exposure apparatus which is capable of enhancing exposure precision can be realized by improving alignment accuracy achieved as a result of reduction of vibration.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the present invention are described in detail below with reference to the drawings.

First Exemplary Embodiment

Figure 1:
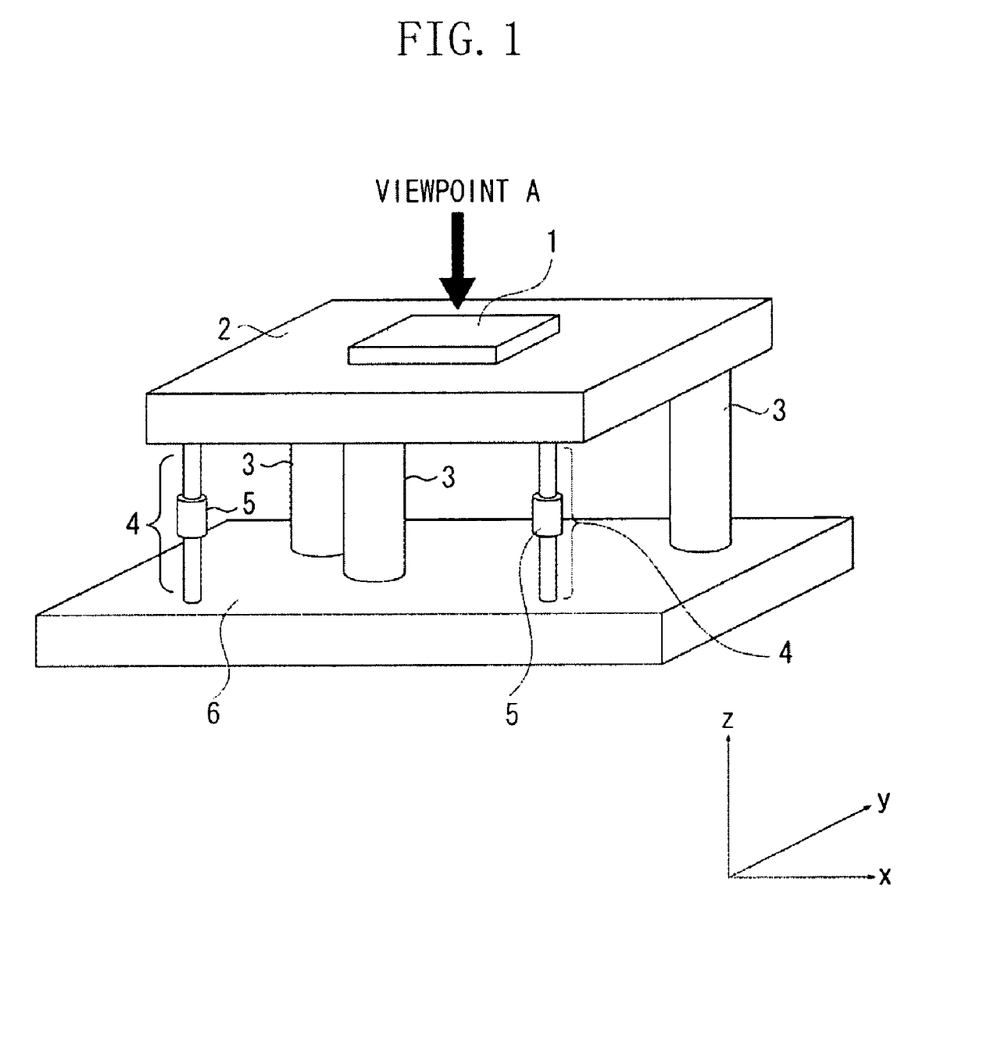
FIG. 1 illustrates apart of a structure of an exposure apparatus according to an exemplary embodiment of the present invention.
Figure 2:
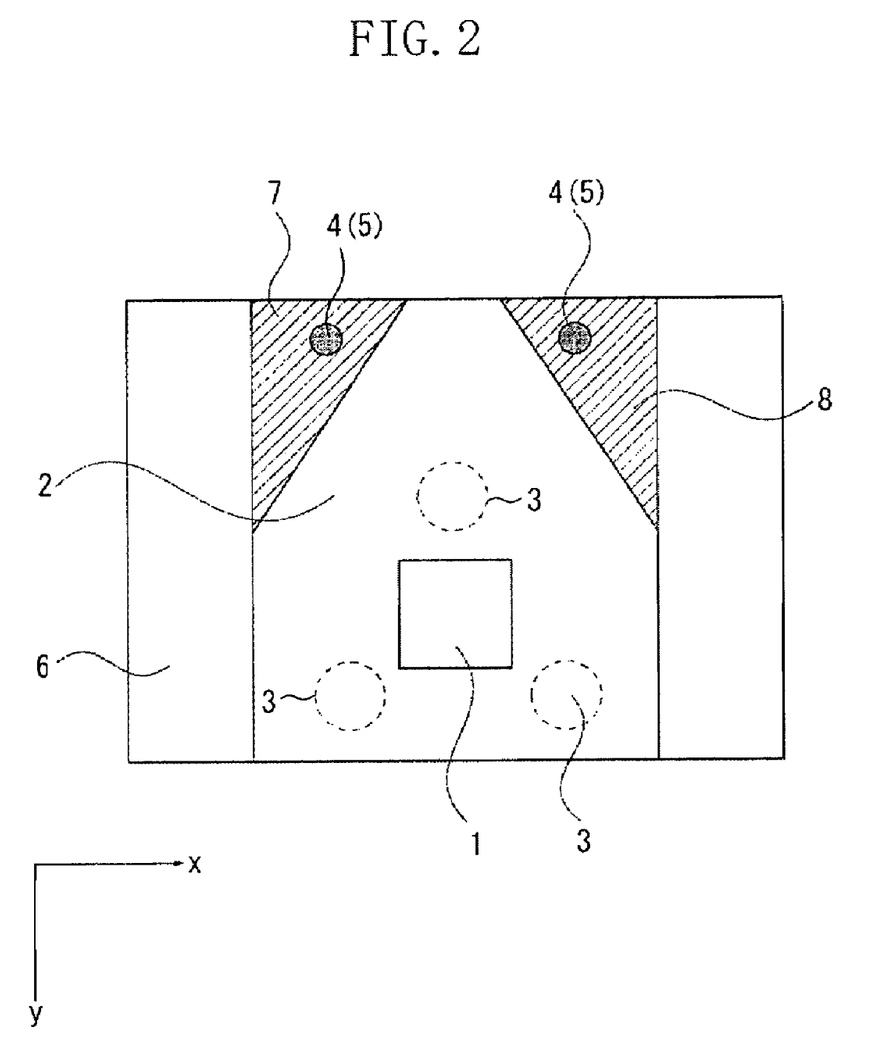
FIG. 2 illustrates the exposure apparatus in FIG. 1 when viewed from a viewpoint "A".

The exposure apparatus according to an exemplary embodiment of the present invention includes a reticle stage 1, a structure 2 for supporting the reticle stage 1, a first supporting member 3 (hereinafter referred to as supporting member 3), and a second supporting member 4 (hereinafter referred to as supporting member 4) as illustrated in FIGS. 1 and 2. In the embodiment shown in FIGS. 1 and 2, three of the supporting members 3 and two of the supporting members 4 are used. The supporting member 4 includes a unit 5 configured to dampen vibration. Further, the supporting members 3 and 4 are arranged on a plane 6. The plane 6 is a surface plane of a structure for supporting, for example, a projection optical system, or a floor and is not limited to a specified one.

The shape of the structure 2 for supporting the reticle stage 1 is rectangular, however, the shape is not limited to a rectangle or a square. For example, the structure 2 may alternatively be a hexagon, an octagon, or other n-gon shape. However, it is desirable that the shape of the structure 2 is linesymmetrical with a driving direction of the reticle stage. This is because when driving the reticle stage 1, if the structure 2 for supporting the reticle stage 1 is not symmetrical, a moment may be generated according to the drive of the reticle stage 1.

Further, as illustrated in FIG. 2, although the arrangement of the supporting member 3 is not limited in number, using three supporting members 3 to support the structure 2 at three places is useful from a viewpoint of avoiding excessive constraint. The supporting member 3 may be, for example, a conventional kinematic mount discussed in Japanese Patent Application Laid-Open No. 2004-078209 and Japanese Patent Application Laid-Open No. 11-153855.

The supporting members 4 are desirably arranged to support corner portions 7 and 8 which are not supported by the supporting members 3. The corner portions 7 and 8 are two corner portions out of the four corner portions of the structure 2 for supporting the reticle stage 1. Thus, the supporting members 4 are not necessarily arranged at all corner portions of the structure 2. The supporting members 4 are arranged at the corner portions which are arranged in cantilever fashion and in which the amplitude of vibration is considered to have an adverse effect on the exposure precision.

For example, if the supporting members 3 support the structure 2 at three places, when a distance from each of the three supporting members 3 to a nearest corner of the structure 2 is compared, the distance from at least one supporting member 3 to the nearest corner of the structure 2 may be longer than the distances from the other two supporting members 3. In such a case, it is desirable that the supporting member 4 is arranged at a corner nearest the supporting member 3 which is farthest from the nearest corner of the structure 2. The corner portions 7 and 8 illustrated in FIG. 2 are exemplary. The supporting member 4 may alternatively be disposed at other locations in accordance with the present invention.

For example, in the case where the structure 2 for supporting the reticle stage 1 has an n-gonal shape, the vibration of the structure 2 can be dampened by arranging one or more supporting member 4 outside an area having a boundary that inscribes the supporting members 3 but inside the n corners of the structure 2.

Second Exemplary Embodiment

Figure 8:
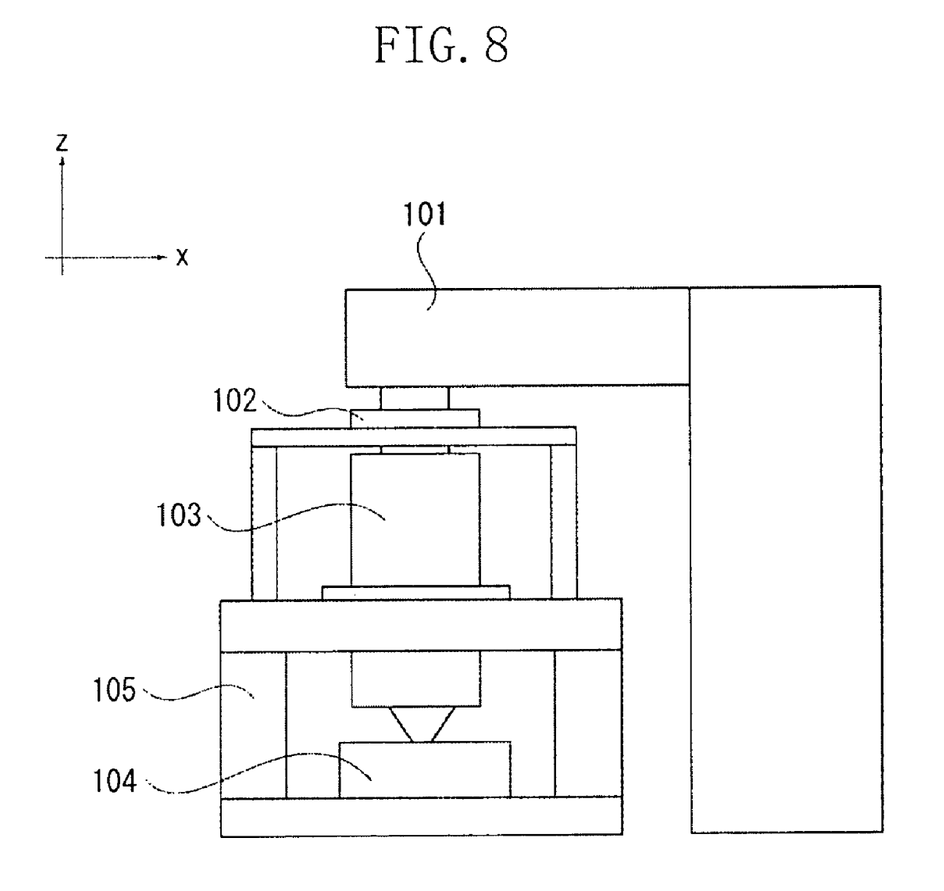
FIG. 8 illustrates an exposure apparatus according to an exemplary embodiment of the present invention.

FIG. 8 illustrates an exposure apparatus 105 including an illumination apparatus 101, a reticle stage 102 mounting a reticle, a projection optical system 103, and a wafer stage 104 that mounts a wafer. The exposure apparatus 105 is configured to project and expose a circuit pattern formed on the reticle onto the wafer. The exposure apparatus 105 may be either a step-and-repeat projection exposure apparatus or a step-and-scan projection exposure apparatus.

The illumination apparatus 101 illuminates the reticle on which a circuit pattern is formed and includes a light source unit and an illumination optical system. Laser, for example, is used as a light source in the light source unit. An Argon fluoride (ArF) excimer laser of a 193 nm-wavelength, krypton fluoride (KrF) excimer laser of a 248 nm-wavelength, or molecular fluorine (F2) excimer laser of a 157 nm-wavelength may be used as the light source. However, the laser is not limited to excimer laser and, for example, YAG laser may also be used. One or more laser may be used, the number of lasers is not limited. A light flux shaping optical system and an incoherent optical system may also be used. The light flux shaping optical system is capable of shaping a parallel light flux emitted from the laser light source into a desired beam shape. The incoherent optical system converts a coherent laser light flux into an incoherent light flux Further, the light source of the light source unit is not limited to laser and one or a plurality of mercury lamps or xenon lamps may alternatively be used.

The illumination optical system is an optical system that illuminates the reticle. The illumination optical system includes a lens, a mirror, a light integrator, and a diaphragm (not illustrated). An appropriate configuration for such a light source unit and illumination optical system are understood in the art.

The projection optical system 103 maybe, for example, an optical system including a plurality of lens elements, an optical system (catadioptric optical system) including a plurality of lens elements and at least one concave mirror, an optical system including a plurality of lens elements and at least one diffractive optical element such as a kinoform element, or an all-mirror optical system.

The reticle stage 102 and the wafer stage 104 are movable, for example, by a linear motor. If the exposure apparatus is a step-and-scan projection exposure apparatus, the reticle stage 102 and the wafer stage 104 move in synchronization with one another. In addition, an actuator is included in at least one of the wafer stage 104 and the reticle stage 102. The actuator is used for aligning the reticle pattern on the wafer.

The exposure apparatus 105 is not limited to the above-described configurations. For example, a plurality of wafer stages may be included in the exposure apparatus 105. Further, the exposure apparatus 105 may be an immersion exposure apparatus.

Above exposure apparatuses can be used, for example, for manufacturing a semiconductor device such as a semiconductor integrated circuit or a device having fine patterns such as a micromachine or a thin film magnetic head.

Figure 3:
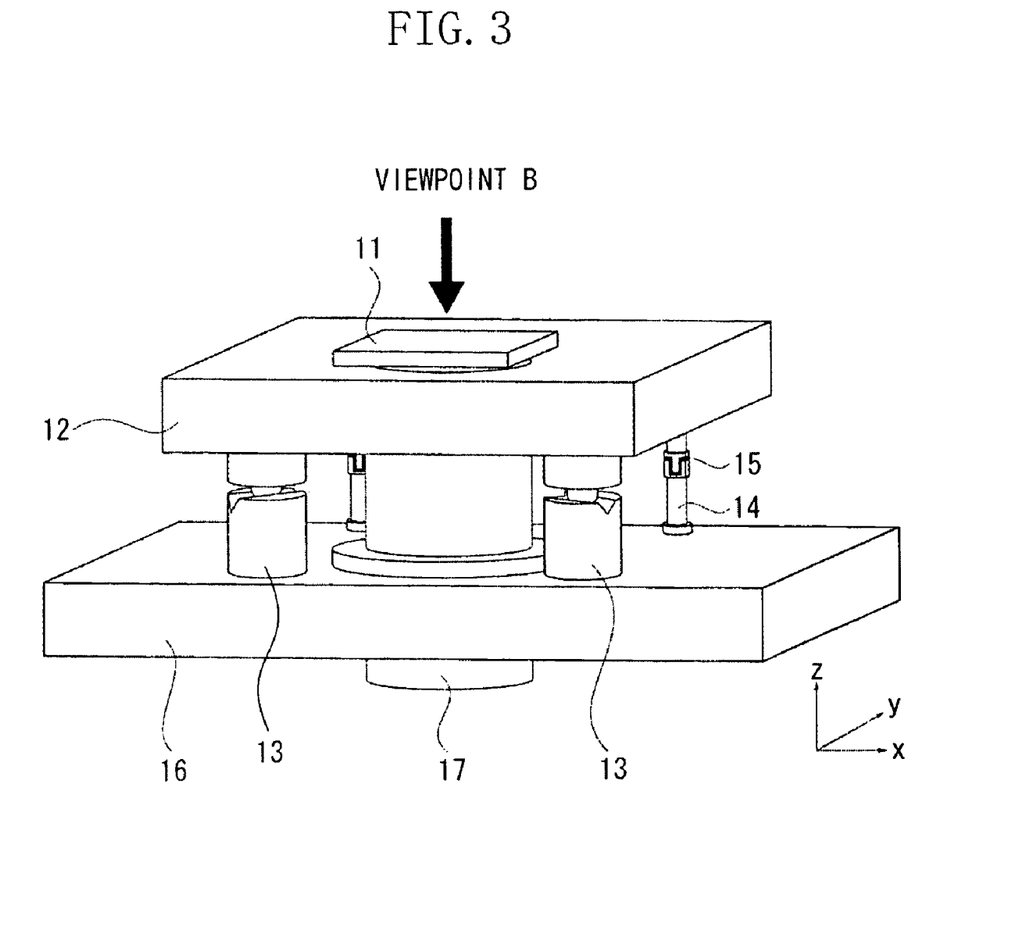
FIG. 3 is a structure of a part of the exposure apparatus according to an exemplary embodiment of the present invention.
Figure 4:
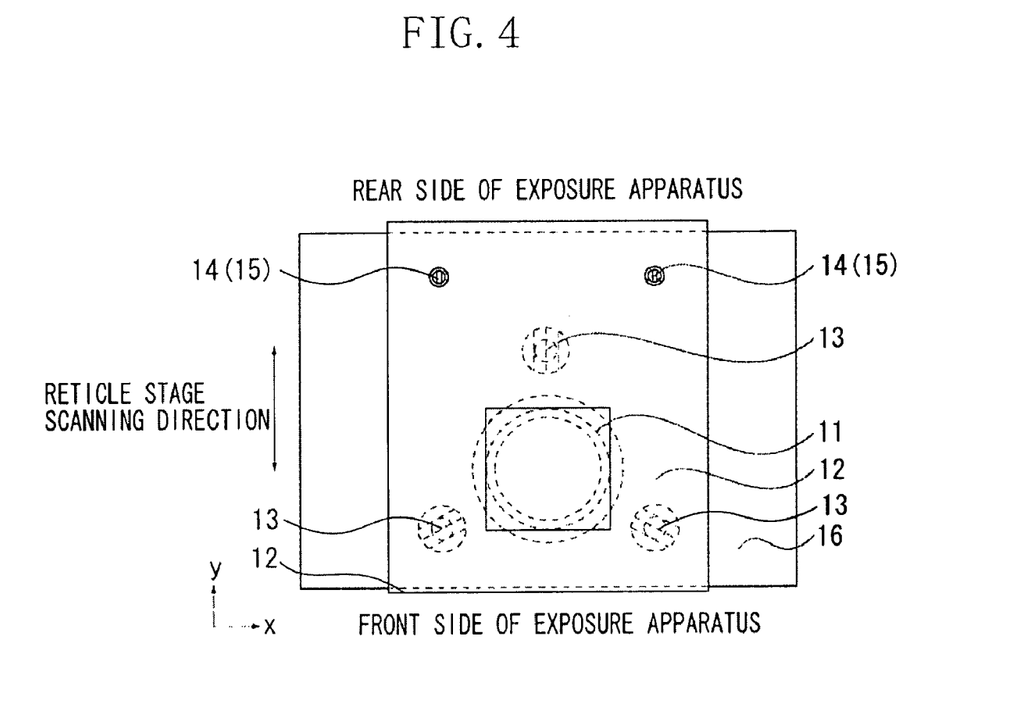
FIG. 4 illustrates the exposure apparatus in FIG. 3 when viewed from a viewpoint "B".

Reference is now made to FIGS. 3 and 4. FIG. 3 is a structure of a part of the exposure apparatus according to the present exemplary embodiment. FIG. 4 illustrates the exposure apparatus in FIG. 3 when viewed from a viewpoint B.

The exposure apparatus is a scanning exposure apparatus including a reticle stage 11 which scans in a direction of an arrow in FIG. 4. A projection optical system 17 is supported by a structure 16. The reticle stage 11 is supported by a structure 12. The structure 12 is rectangular and its long sides are in parallel with the scanning direction of the reticle stage 11. The rectangular shape of the structure 12 for supporting the reticle stage 11 is only exemplary, and the structure 12 may take a different shape.

As illustrated in FIG. 4, three first supporting members 13 (hereinafter referred to as supporting members 13) are arranged on the structure 16 for supporting the projection optical system 17 to connect the structure 16 with the structure 12 for supporting the reticle stage 11. The three supporting members 13 are arranged on a circumference of a circle around the optical axis of the projection optical system 17 at three points at an angular interval of 120°. The supporting member 13 may be, for example, a kinematic mount as discussed in Japanese Patent Application Laid-Open No. 2004-078209 and Japanese Patent Application Laid-Open No. 11-153855 or a column-shaped member. The supporting members 13 are arranged such that two of the three supporting members 13 are positioned at two of the four corner portions of the structure 12 for supporting the reticle stage 11. Here, the corner portion refers to an area including a corner of a polygon.

The supporting members 13 illustrated in FIG. 3 include a V-shaped groove. A spherical shaped member is set into the groove. In this way, deformation is less likely to be transferred between the structure 12 for supporting the reticle stage 11 and the structure 16 for supporting the projection optical system 17.

As can be seen from FIG. 4, the right corner portion and the left corner portion on the rear side of the structure 12 for supporting the reticle stage 11 are arranged in cantilever fashion. Notice that the distance from the supporting members 13 to these corner portions is longer than the distance from the supporting members 13 to corners of the front side of the structure 12. Accordingly, vibration of these corner portions at the rear side of the structure 12 has higher amplitude than vibration at the front side of the structure 12. According to this configuration, the vibration of the structure 12 for supporting the reticle stage 11 and the structure 16 for supporting the projection optical system 17 have a main component in a Z direction.

Figure 5:
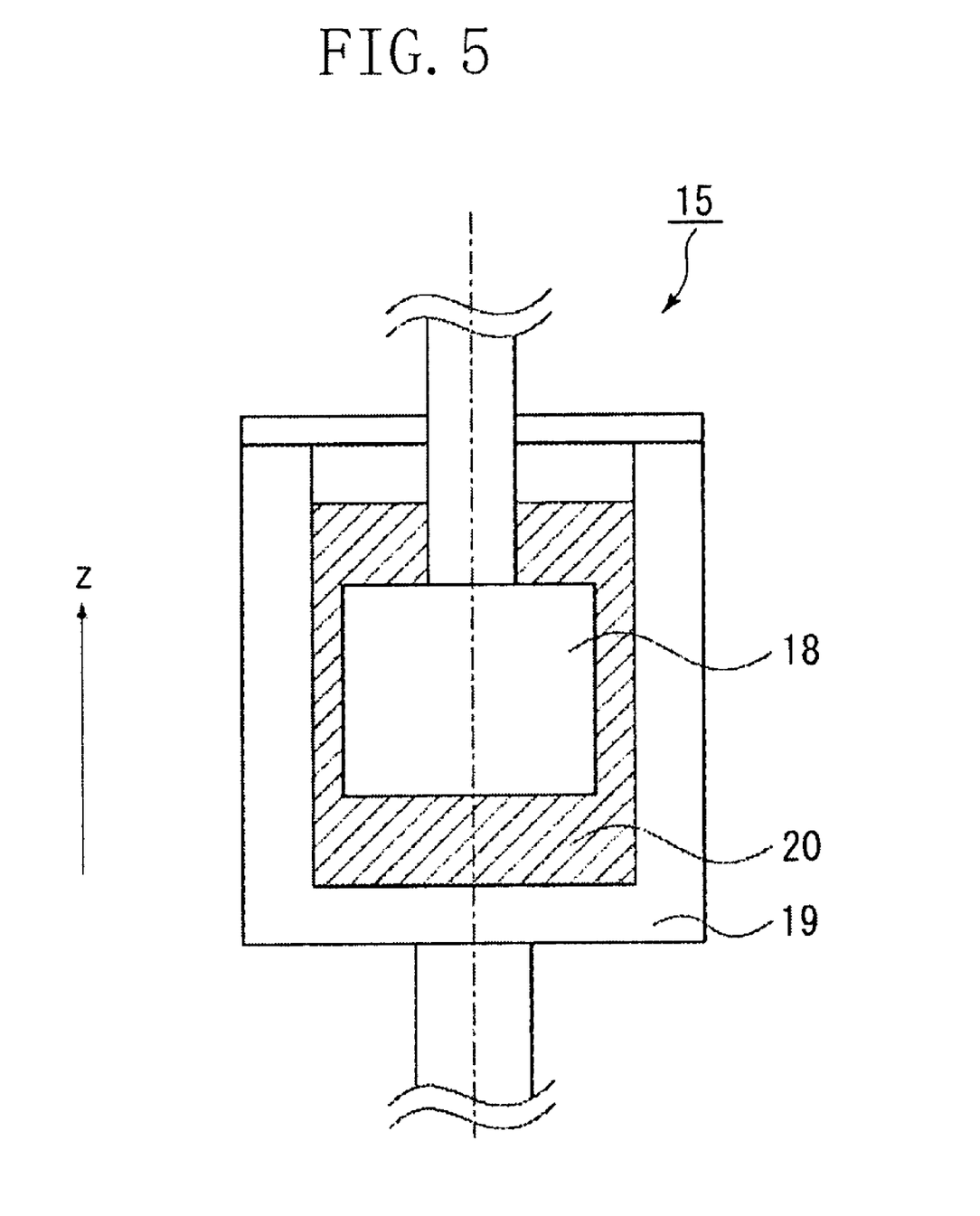
FIG. 5 illustrates a cross section of an oil damper which is a mechanism configured to dampen vibration according to an exemplary embodiment of the present invention.

In order to dampen this vibration, a second supporting member 14 (hereinafter referred to as the supporting member 14) including a mechanism 15 configured to dampen vibration is fixed to the structure 12. Reference is now made also to FIG. 5 which illustrates exemplary details of the mechanism 15. The mechanism 15 for dampening vibration includes a piston 18, a cylinder 19, and viscous fluid 20 filled into the cylinder 19. The mechanism 15 utilizes resistance of the viscous fluid 20 which passes between the piston 18 and the cylinder 19. Silicon oil, which is high in viscosity, is useful as a material of the viscous fluid 20. Fluorine oil may alternatively be used and is particularly useful if the exposure apparatus is to be used for manufacturing semiconductors because the amount of degassing, which may cause lens fogging, is small.

The mechanism 15 for dampening vibration generates a damping force in an axial direction of the piston 18 and the cylinder 19. Owing to this damping force, the vibration between the structure 16 for supporting the projection optical system 17 and the structure 12 for supporting the reticle stage 11 is effectively dampened. In this embodiment, the supporting member 14 is arranged at two places, in particular a left corner portion and a right corner portion on the rear side of the structure 12 where the amplitude of vibration between the structures reaches a maximum value. In other words, the supporting member 14 is set at two corner portions which are not supported by the supporting member 13 as the corners at the front side of the structure 12.

In this embodiment, supporting members 14 are arranged at the corner portions arranged in cantilever fashion to reduce the vibrations generated at these corner portions. Other positions for the supporting member 14 are also possible in accordance with the present invention. For example, positioning of the supporting member 14 to effectively dampen vibration may also be determined based on the material or size of the supporting member 13 and the structure 12 for supporting the reticle stage 11.

The supporting member 14 including the mechanism 15 for dampening the vibration is fixed to the structure 16 for supporting the projection optical system 17 and the structure 12 for supporting the reticle stage 11 using a magnet or a bolt.

Figure 6:
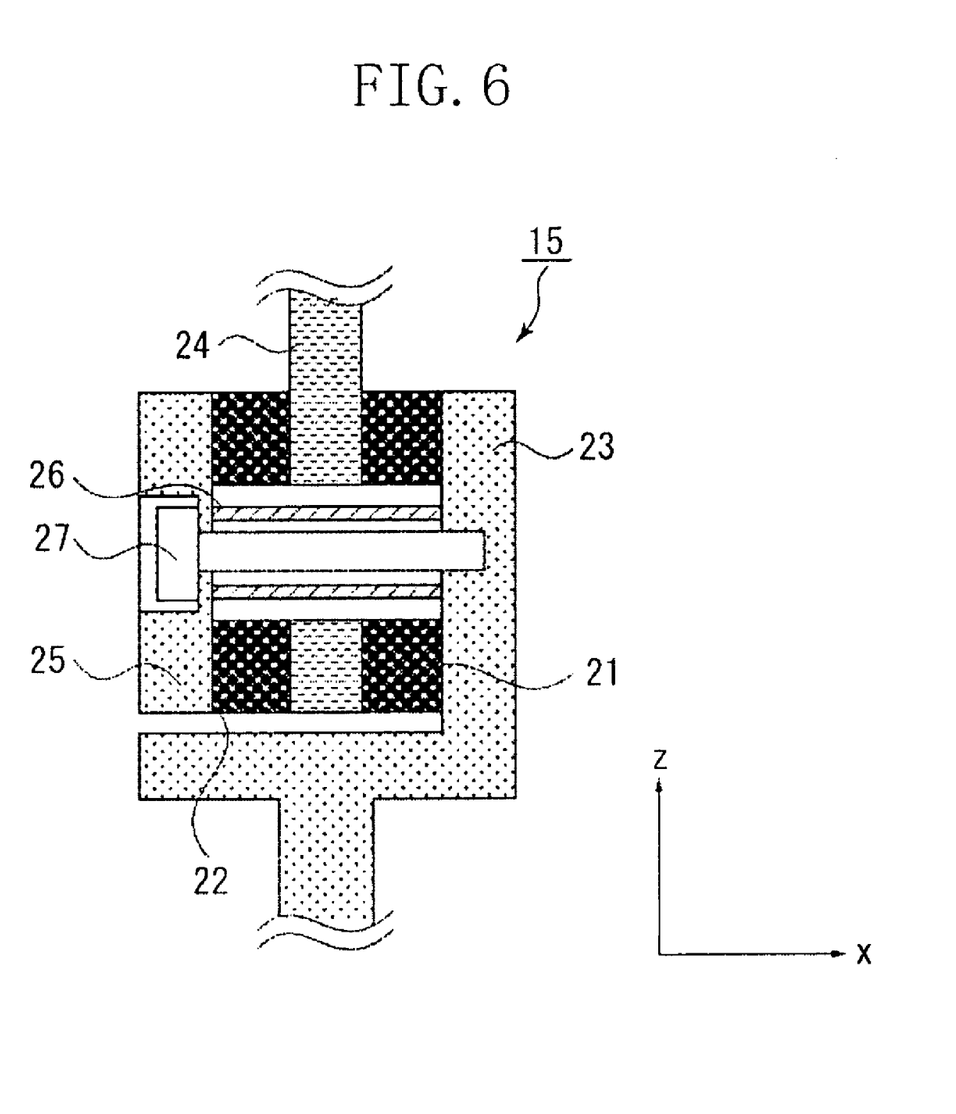
FIG. 6 illustrates a cross section of a viscoelastic damper which is a mechanism configured to dampen vibration according to an exemplary embodiment of the present invention.

FIG. 6 illustrates a viscoelastic member 21 as another exemplary embodiment of the mechanism 15 for dampening the vibration. According to this exemplary embodiment, a force generated by a deformation of a viscoelastic body in a shear direction is used as a dampening force of the vibration.

As illustrated in FIG. 6, the mechanism 15 includes a supporting member 23, the viscoelastic member 21, a supporting member 24, a viscoelastic member 22, and a holding plate 25, which are arranged alternately. The viscoelastic members 21 and 22 have a similar shape. There is a hole opened through the viscoelastic members 21 and 22 and the supporting member 24 into which a gap control member 26 is inserted. The gap control member 26 is tube-shaped which allows a screw 27 to go through it. A size of the gap control member 26 in an X direction is slightly smaller than a net measure of the viscoelastic member 21, the supporting member 24, and the viscoelastic member 22 in the X direction. By screwing the screw 27 into the supporting member 23 in this state, the viscoelastic members 21 and 22 will be slightly compressed, and their viscous force will be increased compared to when the viscoelastic members 21 and 22 are not compressed.

If vibration is generated which changes relative distance between the structure 16 for supporting the projection optical system 17 and the structure 12 for supporting the reticle stage 11 in the Z direction, then the viscoelastic members 21 and 22 are deformed in the shear direction in the XZ plane and a damping force is generated.

Since the structure 16 for supporting the projection optical system 17 contacts the structure 12 for supporting the reticle stage 11 through the viscoelastic members 21 and 22, only minor deformation is transferred between the structure 16 and the structure 12.

As a material for the viscoelastic members 21 and 22, silicon rubber, fluoro rubber, Hanenaito (trade name) rubber or the like can be used. If the viscoelastic members 21 and 22 are used in a semiconductor exposure apparatus, then the material is desirably fluoro rubber or Hanenaito rubber since the amount of degassing of these rubbers are small. Degassing may cause lens fogging.

Further, if a kinematic supporting member is used for the supporting members 13 as described above, the following effect may also occur.

If as a kinematic support, a spherical-shaped member is set into a V-shaped groove according to the present exemplary embodiment, the joint portion will be extremely small since the contact area will be an area where the spherical surface and the plane contact. Accordingly, a spring constant k of the contact portion of the supporting member is decreased and natural frequency f is reduced. This may cause vibration. Further, if mass m1 and mass m2 of the two structures which are connected with each other are increased, vibration will also be increased. For example, in a simplified model where the mass m1 and the mass m2 are connected with each other by a spring, natural frequency f will be small as illustrated in equation (1) below.

$$f = \frac{1}{2\pi}\sqrt{\frac{(m_1+m_2)k}{m_1 m_2}} \quad (1)$$

Therefore, by providing the supporting member 14 including the mechanism 15 for dampening vibration, vibration which is generated for the above reason when a kinematic supporting member is used in the supporting member 13 can be reduced effectively.

Third Exemplary Embodiment

Figure 7:
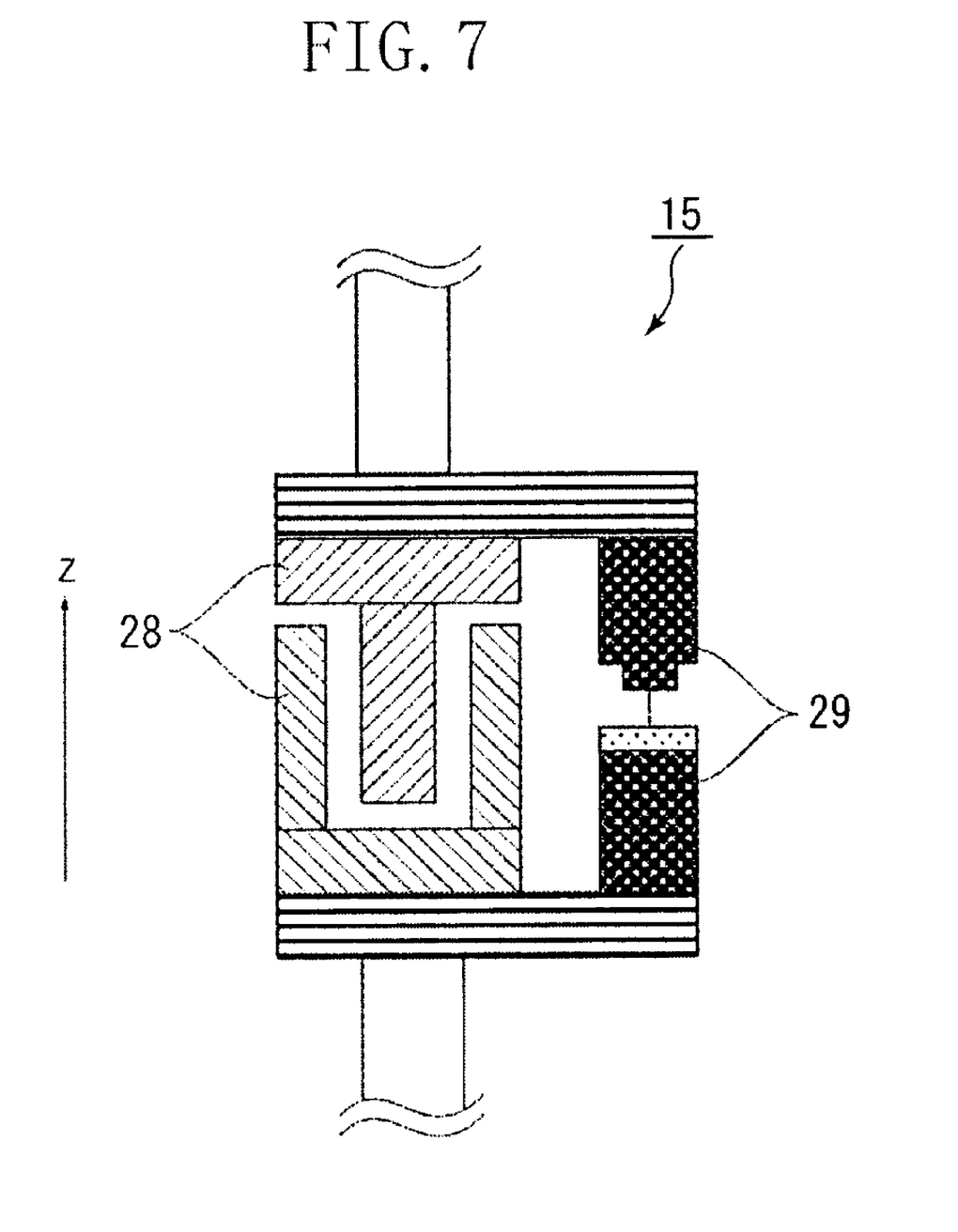
FIG. 7 illustrates a cross section of an active damper which is a mechanism configured to dampen vibration according to an exemplary embodiment of the present invention.

As another exemplary embodiment of the present invention, an active damper is used in place of the mechanism 15 configured to dampen the vibration as illustrated in FIG. 7. A measurement unit 29 and an actuator 28 are the main components of the active damper. The measurement unit 29 measures a relative distance between the structure 12 for supporting the reticle stage 11 and the structure 16 for supporting the projection optical system 17.

Based on a signal output from the measurement unit 29, the actuator 28 generates a force in a direction that dampens vibration between the structure 12 for supporting the reticle stage 11 and the structure 16 for supporting the projection optical system 17. The active damper is believed to provide a higher damping rate at a specifiable frequency than the passive damper of the second embodiment.

The actuator 28 may be a contactless linear motor, for example. If a contact-type actuator is used, deformation may be transferred from the contact portion. If the deformation is transferred from the contact portion, it reduces the advantage of this structure that prevents transfer of deformation by supporting a structure at three places with supporting members 13.

Further, a laser displacement meter which is capable of directly measuring a direction can be used as the measurement unit 29. Further, a speedometer or an accelerometer can be fixed to both sides of the structure 12 for supporting the reticle stage 11 and the structure 16 for supporting the projection optical system 17 to calculate a positional difference of the structure 12 and the structure 16. Thus, a relative positional change between the structure 12 and the structure 16 can be detected.

In the second and third exemplary embodiments, the structure 12 for supporting the reticle stage 11 is supported by the structure 16 for supporting the projection optical system 17 via the supporting members 13 and 14. However, the configuration is not limited to such a structure. For example, the structure 12 for supporting the reticle stage 11 may be supported by any structure via the supporting members 13 and 14 so long as the structure 12 serves as a component of the exposure apparatus.

Fourth Exemplary Embodiment

According to another embodiment, a device such as a semiconductor integrated circuit element, a liquid crystal display element or the like is manufactured through an exposure process, a developing process, and other conventional processes. However, in this embodiment, the exposure process is modified relative to a conventional exposure process in that an exposure apparatus according to any of the above-described exemplary embodiments is used instead of a conventional exposure apparatus. The substrate is exposed to light through the exposure process, the exposed substrate is developed through the developing process, and the developed substrate is processed through conventional processes.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-182153 filed Jul. 11, 2007, which is hereby incorporated by reference herein in its entirety.

What is claimed is:

1. An exposure apparatus configured to expose a substrate to light to transfer a pattern of a reticle to the substrate, the exposure apparatus comprising:
a reticle stage configured to mount the reticle;
a structure configured to support the reticle stage;
three first supporting members configured to support the structure at three places and constitute a kinematic mount; and
a second supporting member configured to support the structure outside an area surrounding the three first supporting members, the second supporting member having a damper configured to dampen vibration of the structure,
wherein the damper dampens vibration of the structure by driving a non-contact-type actuator.

2. The exposure apparatus according to claim 1, wherein a cross-sectional shape of the structure on a plane level with a reticle mounting plane of the reticle stage is an n-gon, where $n \geq 4$ and
wherein the second supporting member supports a corner portion unsupported by the first supporting members among n corner portions of the structure configured to support the reticle stage.

3. The exposure apparatus according to claim 1, wherein the reticle stage is driven in a driving direction, and the cross-sectional shape of the structure on a plane level with a reticle mounting plane of the reticle stage is symmetric with respect to a straight line extending in the driving direction.

4. A device manufacturing method comprising:
exposing a substrate to light to transfer a pattern of a reticle onto the substrate using an exposure apparatus,
wherein the exposure apparatus comprises:
a reticle stage configured to mount the reticle;
a structure configured to support the reticle stage;
three first supporting members configured to support the structure at three places and constitute a kinematic mount; and
a second supporting member configured to support the structure outside an area surrounding the three first supporting members, the second supporting member having a damper configured to dampen vibration of the structure,
wherein the damper dampens vibration of the structure by driving a non-contact-type actuator.

5. The exposure apparatus according to claim 1, wherein the damper includes a measurement unit configured to measure a distance between the structure configured to mount the reticle stage and a plane on which the first supporting members and the second supporting member are arranged, and includes a linear motor configured to generate a force in a direction to dampen vibration between the structure and the plane based on an output signal of the measurement unit.

* * * * *